US010742166B2

(12) United States Patent
Al Shakarchi et al.

(10) Patent No.: US 10,742,166 B2
(45) Date of Patent: Aug. 11, 2020

(54) METHOD FOR THE ELECTRICAL CHARACTERIZATION OF A PHOTOVOLTAIC CELL

(71) Applicant: Commissariat a l'energie atomique et aux energies alternatives, Paris (FR)

(72) Inventors: Franck Al Shakarchi, Saint-Sulpice (FR); Duy Long Ha, Chambery le Vieux (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 103 days.

(21) Appl. No.: 16/166,335

(22) Filed: Oct. 22, 2018

(65) Prior Publication Data
US 2019/0123683 A1   Apr. 25, 2019

(30) Foreign Application Priority Data
Oct. 23, 2017   (FR) .................... 17 59997

(51) Int. Cl.
*H02S 50/10* (2014.01)
*H01L 31/02* (2006.01)
(Continued)

(52) U.S. Cl.
CPC .......... *H02S 50/10* (2014.12); *H01L 31/0201* (2013.01); *H02J 3/383* (2013.01);
(Continued)

(58) Field of Classification Search
CPC .......... H02S 50/10; H02S 50/00; H02S 40/32; H02S 40/34; H01L 31/0201; H01L 31/044; H02J 3/383

USPC .............. 324/500, 600, 764.01, 103 R, 771, 324/761.01, 501, 639, 642, 702, 76.11, 324/76.66, 96
See application file for complete search history.

(56) References Cited

U.S. PATENT DOCUMENTS

2015/0094967 A1   4/2015   Kouno et al.
2017/0063304 A1   3/2017   Ko et al.

FOREIGN PATENT DOCUMENTS

JP   2003-324207   11/2003

OTHER PUBLICATIONS

French Preliminary Search Report dated Mar. 1, 2018 in French Application 17 59997 filed on Oct. 23, 2017 (with English Translation of Categories of Cited Documents and Written Opinion).

*Primary Examiner* — Melissa J Koval
*Assistant Examiner* — Trung Nguyen
(74) *Attorney, Agent, or Firm* — Oblon, McClelland, Maier & Neustadt, L.L.P.

(57) ABSTRACT

A method for the electrical characterization of a photovoltaic cell of a photovoltaic module, the method including steps of obtaining the irradiance received by the photovoltaic module, obtaining a temperature of each photovoltaic cell of a first submodule of the photovoltaic module, comparing the temperature obtained for each photovoltaic cell of the first submodule with a reference temperature, determining the state of each photovoltaic cell of the first submodule between a healthy state, in which its temperature is equal to the reference temperature, and a faulty state, in which its temperature is different from the reference temperature, estimating the I-V curve associated with a first photovoltaic cell of the first submodule, by searching in a database of I-V curves.

18 Claims, 9 Drawing Sheets

(51) Int. Cl.
*H02S 50/00* (2014.01)
*H02S 40/32* (2014.01)
*H02S 40/34* (2014.01)
*H02J 3/38* (2006.01)

(52) U.S. Cl.
CPC .............. *H02S 40/32* (2014.12); *H02S 40/34* (2014.12); *H02S 50/00* (2013.01)

METHOD FOR THE ELECTRICAL CHARACTERIZATION OF A PHOTOVOLTAIC CELL

TECHNICAL FIELD OF THE INVENTION

The present invention pertains to a method for the electrical characterization of a photovoltaic cell of a photovoltaic module.

The invention also relates to a system for the electrical characterization of a photovoltaic cell of a photovoltaic module.

PRIOR ART

A photovoltaic architecture, as a general rule, includes a plurality of strings of photovoltaic modules (also called photovoltaic panels or solar panels) that are connected in parallel. In each string, the photovoltaic modules are connected in series. Each photovoltaic module includes a plurality of photovoltaic cells connected in series, in the form of rows of cells. Each photovoltaic cell is intended to convert solar energy into electrical energy. The strings of photovoltaic modules are linked to a voltage converter, such as for example an inverter that makes it possible to convert the DC voltage supplied by each string of modules into an AC voltage. The converter also has the role of determining an operating point for which the power delivered by the whole photovoltaic architecture is at a maximum (maximum power point, denoted MPP).

The presence of a fault in a string of photovoltaic modules hinders the electricity production of the entire string, and therefore of the entire electricity production architecture.

It is therefore necessary to monitor the operating state of each photovoltaic module of a string in order to spot any possible fault with a module and to mitigate it as quickly as possible. As the case may be, the fault may be of various types, in particular a permanent one if it involves a hardware problem or a temporary one if it involves for example the presence of a shadow or of dust on the module.

Several monitoring solutions have already been proposed for detecting operating faults with modules. Patent applications US2015/094967A1, WO2012/128807A1, FR2956213A1, WO2010/118952A1, U.S. Pat. No. 9,048,781B2 or US2014/266294A1 all describe solutions of this kind. To check the operating state of a module, the majority of solutions are based in particular on the analysis of current-voltage curves, more commonly called I-V curves.

A photovoltaic module is specifically characterized by a set of reference I-V curves for various levels of insolation (expressed in watts/m$^2$). In other words, for a given level of insolation, a healthy photovoltaic module, that is to say one that is not defective, will theoretically be capable of following one of the reference I-V curves for this level of insolation. By contrast, if a module exhibits an operating fault, its I-V curve then moves away from this reference curve for this level of insolation.

In the majority of the solutions described in the patent documents referenced above, the I-V curve of a module is determined using a plurality of sensors, in particular one current sensor for each module, thereby making the architecture more complex and increasing the cost thereof. To determine the operating state of a module, certain solutions also require cutting off the electricity production of the string.

At the present time, there are therefore no simple solutions that make it possible to determine the I-V curve of a photovoltaic module without using either a current sensor or a voltage sensor.

The aim of the invention is therefore to propose a solution that is able to meet this objective.

Through the electrical characterization of each photovoltaic cell of a photovoltaic module, it will thus be possible to determine the electrical properties of the photovoltaic module as a whole.

DISCLOSURE OF THE INVENTION

This aim is achieved by a method for the electrical characterization of a photovoltaic cell of a photovoltaic module, said photovoltaic module including a plurality of photovoltaic cells connected to one another and one or more bypass diodes, each bypass diode being configured to bypass a submodule formed of one or more photovoltaic cells of said photovoltaic module, said method including steps of:

Obtaining the irradiance received by said photovoltaic module,

Obtaining a temperature of each photovoltaic cell of a first submodule of said photovoltaic module, Comparing said temperature obtained for each photovoltaic cell of the first submodule with a reference temperature, Determining the state of each photovoltaic cell of the first submodule between a healthy state, in which its temperature is equal to the reference temperature, and a faulty state, in which its temperature is different from said reference temperature, Estimating the I-V curve associated with a first photovoltaic cell of said first submodule, by searching in a database of I-V curves, taking into account:

The healthy state or the faulty state of said first photovoltaic cell;

The healthy state or the faulty state of all of the other photovoltaic cells of the first submodule;

The electric power supplied by each photovoltaic cell of the first submodule.

According to one particular feature:

If the first photovoltaic cell is in said faulty state, it includes a step of:

Determining whether the first photovoltaic cell belongs to a string of modules in which all of the photovoltaic cells are in the faulty state or whether the first photovoltaic cell belongs to a string of modules in which at least one photovoltaic cell is in a healthy state.

According to another particular feature:

If the first photovoltaic cell belongs to a string of modules in which at least one photovoltaic cell is in a healthy state, it includes a step of:

Determining whether the first photovoltaic cell belongs to a submodule that includes at least one cell in the healthy state or to a submodule that does not include any cells in the healthy state.

According to another particular feature:

If the first photovoltaic cell belongs to a submodule that includes at least one cell in the healthy state, it includes a step of:

Comparing the temperature of the first cell with said reference temperature in order to determine whether said temperature of the first cell is higher than said reference temperature or lower than said reference temperature.

According to another particular feature:

If the temperature of the first photovoltaic cell is lower than the reference temperature, it consists in implementing a loop of searching for the I-V curve associated with said first photovoltaic cell, said search loop comprising:

A step of applying a first irradiance;

A step of determining, in the database of I-V curves, a first I-V curve corresponding to said first irradiance and to said temperature of the first photovoltaic cell;

On the basis of said first curve, a step of determining the voltage that corresponds to the current at the maximum power point;

A step of satisfying the following relationship:

$$G = P_{th\_cell\_k} + I_{mpp} \times V(I_{mpp})$$

In which:

G corresponds to said first irradiance introduced at input;

$P_{th\_cell\_k}$ corresponds to the thermal power generated by said first photovoltaic cell;

$I_{mpp}$ corresponds to the current at the maximum power point;

$V(I_{mpp})$ corresponds to the voltage determined on said first I-V curve for said current at the maximum power point;

If said relationship is satisfied, said I-V curve is valid;

If said relationship is not satisfied, said loop is restarted while modifying the irradiance value applied at input.

According to another particular feature:

If the temperature of the first photovoltaic cell is higher than the reference temperature, it includes:

A step of determining the voltage of the faulty first photovoltaic cell from the following relationship:

$$V_{cell\_k} = V_{mpp} - \Delta P_{th\_cell\_k}/I_{mpp}$$

In which:

$V_{cell\_k}$ corresponds to the voltage of the first photovoltaic cell;

$V_{mpp}$ corresponds to the voltage at the maximum power point;

$\Delta P_{th\_cell\_k}$ corresponds to the energy losses caused by the faulty first photovoltaic cell;

$I_{mpp}$ corresponds to the current at the maximum power point;

A step of searching, in the database of I-V curves, for the I-V curve that corresponds to a reference irradiance, and for which the point whose coordinates are said voltage determined for the first photovoltaic cell and the current at the maximum power point belongs to the curve.

According to another particular feature:

If the first photovoltaic cell belongs to a submodule that does not include any cells in the healthy state, it includes a step of:

Determining whether all of the cells of its submodule have zero electric power or whether at least one cell of said submodule has a nonzero electric power.

According to another particular feature:

If all of the cells of its submodule have zero electric power, it includes a step of:

Estimating the I-V curve associated with said first photovoltaic cell by searching, in a database of I-V curves, for an I-V curve defined by $$\{(I,V) \text{ such that } I \geq 0 \text{ and } V=0\} \text{ and } \{(I,V) \text{ such that } I=0 \text{ and } V \geq 0\};$$

According to another particular feature:

If at least one cell of said submodule has a nonzero electric power, it consists in implementing a loop of searching for the I-V curve associated with said first photovoltaic cell, said search loop comprising:

A step of applying a first current;

A step of determining, for each photovoltaic cell of said submodule, the voltage of the cell from the following relationship:

$$V_{cell\_k}(I_{in}) = (P_{elec\_healthy} - \Delta P_{th\_cell\_k})/I_{in}$$

In which:

$V_{cell\_k}$ corresponds to the voltage of each photovoltaic cell of said submodule, where k=1 to n photovoltaic cells in the submodule;

$I_{in}$ corresponds to said first current applied at input;

$P_{elec\_healthy}$ corresponds to the power supplied by a photovoltaic cell in a healthy state;

$\Delta P_{th\_cell\_k}$ corresponds to the energy losses caused by each faulty photovoltaic cell;

A step of determining the sum of the voltages of all of the photovoltaic cells of the submodule;

A step of checking whether said sum is zero or nonzero;

If said sum is zero:

A step of estimating the I-V curve associated with said first photovoltaic cell by searching, in a database of I-V curves, for an I-V curve for which the point whose coordinates are said voltage determined for the first photovoltaic cell and the first current applied at input belongs to the curve;

If said sum is nonzero;

A step of modifying the first current applied at input and of implementing said search loop again, taking into account the modified first current.

The invention also relates to a system for the electrical characterization of a photovoltaic cell of a photovoltaic module, said photovoltaic module including a plurality of photovoltaic cells connected to one another and one or more bypass diodes, each bypass diode being configured to bypass a submodule formed of one or more photovoltaic cells of said photovoltaic module, the system including:

A module for obtaining the irradiance received by said photovoltaic module,

A module for obtaining a temperature of each photovoltaic cell of a first submodule of said photovoltaic module, A module for comparing said temperature obtained for each photovoltaic cell of the first submodule with a reference temperature, A module for determining the state of each photovoltaic cell of the first submodule between a healthy state, in which its temperature is equal to the reference temperature, and a faulty state, in which its temperature is different from said reference temperature, A module for estimating the I-V curve associated with a first photovoltaic cell of said first submodule, by searching in a database of I-V curves, taking into account:

The healthy state or the faulty state of said first photovoltaic cell;

The healthy state or the faulty state of all of the other photovoltaic cells of the first submodule;

The electric power supplied by each photovoltaic cell of the first submodule.

According to one particular feature:

If the first photovoltaic cell is in said faulty state, it is configured to execute:

A module for determining whether the first photovoltaic cell belongs to a string of modules in which all of the photovoltaic cells are in the faulty state or whether the first photovoltaic cell belongs to a string of modules in which at least one photovoltaic cell is in a healthy state.

According to another particular feature:

If the first photovoltaic cell belongs to a string of modules in which at least one photovoltaic cell is in a healthy state, it is configured to execute:

A module for determining whether the first photovoltaic cell belongs to a submodule that includes at least one cell in the healthy state or to a submodule that does not include any cells in the healthy state.

According to another particular feature:

If the first photovoltaic cell belongs to a submodule that includes at least one cell in the healthy state, it is configured to execute:

A module for comparing the temperature of the first cell with said reference temperature in order to determine whether said temperature of the first cell is higher than said reference temperature or lower than said reference temperature.

According to another particular feature:

If the temperature of the first photovoltaic cell is lower than the reference temperature, it is configured to execute a loop of searching for the I-V curve associated with said first photovoltaic cell, said search loop comprising:

A step of applying a first irradiance;

A step of determining, in the database of I-V curves, a first I-V curve corresponding to said first irradiance and to said temperature of the first photovoltaic cell;

On the basis of said first curve, a step of determining the voltage that corresponds to the current at the maximum power point;

A step of satisfying the following relationship:

$$G = P_{th\_cell\_k} + I_{mpp} \times V(I_{mpp})$$

In which:

G corresponds to said first irradiance introduced at input;

$P_{th\_cell\_k}$ corresponds to the thermal power generated by said first photovoltaic cell;

$I_{mpp}$ corresponds to the current at the maximum power point;

$V(I_{mpp})$ corresponds to the voltage determined on said first I-V curve for said current at the maximum power point;

If said relationship is satisfied, said I-V curve is valid;

If said relationship is not satisfied, said loop is restarted while modifying the irradiance value applied at input.

According to another particular feature:

If the temperature of the first photovoltaic cell is higher than the reference temperature, it is configured to execute:

A module for determining the voltage of the faulty first photovoltaic cell from the following relationship:

$$V_{cell\_k} = V_{mpp} - \Delta P_{th\_cell\_k}/I_{mpp}$$

In which:

$V_{cell\_k}$ corresponds to the voltage of the first photovoltaic cell;

$V_{mpp}$ corresponds to the voltage at the maximum power point;

$\Delta P_{th\_cell\_k}$ corresponds to the energy losses caused by the faulty first photovoltaic cell;

$I_{mpp}$ corresponds to the current at the maximum power point;

A module for searching, in the database of I-V curves, for the I-V curve that corresponds to a reference irradiance, and for which the point whose coordinates are said voltage determined for the first photovoltaic cell and the current at the maximum power point belongs to the curve.

According to another particular feature:

If the first photovoltaic cell belongs to a submodule that does not include any cells in the healthy state, it is configured to execute:

A module for determining whether all of the cells of its submodule have zero electric power or whether at least one cell of said submodule has a nonzero electric power.

According to another particular feature:

If all of the cells of its submodule have zero electric power, it is configured to execute:

A module for estimating the I-V curve associated with said first photovoltaic cell by searching, in a database of I-V curves, for an I-V curve defined by $\{(I,V) \text{ such that } I \geq 0 \text{ and } V=0\}$ and $\{(I,V) \text{ such that } I=0 \text{ and } V \geq 0\}$;

According to another particular feature:

If at least one cell of said submodule has a nonzero electric power, it is configured to implement a loop of searching for the I-V curve associated with said first photovoltaic cell, said search loop comprising:

A step of applying a first current;

A step of determining, for each photovoltaic cell of said submodule, the voltage of the cell from the following relationship:

$$V_{cell\_k}(I_{in}) = (P_{elec\_healthy} - \Delta P_{th\_cell\_k})/I_{in}$$

In which:

$V_{cell\_k}$ corresponds to the voltage of each photovoltaic cell of said submodule, where k=1 to n photovoltaic cells in the submodule;

$I_{in}$ corresponds to said first current applied at input;

$P_{elec\_healthy}$ corresponds to the power supplied by a photovoltaic cell in a healthy state;

$\Delta P_{th\_cell\_k}$ corresponds to the energy losses caused by each faulty photovoltaic cell;

A step of determining the sum of the voltages of all of the photovoltaic cells of the submodule;

A step of checking whether said sum is zero or nonzero;

If said sum is zero:

A step of estimating the I-V curve associated with said first photovoltaic cell by searching, in a database of I-V curves, for an I-V curve for which the point whose coordinates are said voltage determined for the first photovoltaic cell and the first current applied at input belongs to the curve;

If said sum is nonzero;

A step of modifying the first current applied at input and of implementing said search loop again, taking into account the modified first current.

BRIEF DESCRIPTION OF THE FIGURES

Other features and advantages will become apparent in the following detailed description that is provided with reference to the appended drawings, in which.

DETAILED DESCRIPTION OF AT LEAST ONE EMBODIMENT

Figure 1:
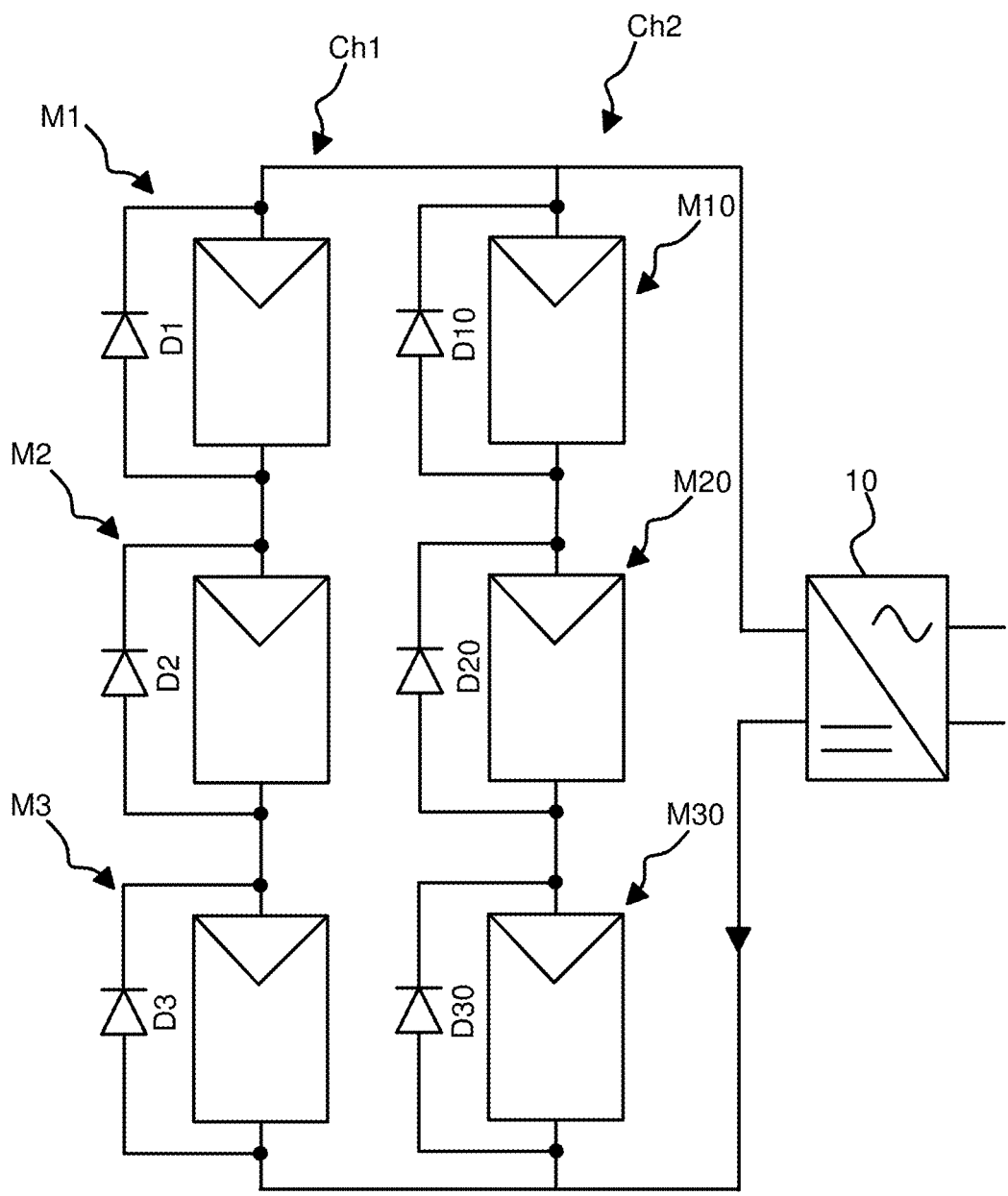
FIG. 1 schematically shows a conventional photovoltaic architecture.

With reference to FIG. 1, a photovoltaic architecture typically has the following particular features in terms of layout and in terms of operation:

A plurality of strings Ch1, Ch2 of photovoltaic modules (also called photovoltaic panels or solar panels) are connected in parallel (two strings in FIG. 1).

Each string of photovoltaic modules includes a plurality of photovoltaic modules connected in series (M1-M3 for string Ch1 and M10-M30 for string Ch2).

A photovoltaic module (generally referenced Mi in the remainder of the text) includes a plurality of photovoltaic cells (not shown in FIG. 1) connected in series. The photovoltaic cells are distributed into a plurality of submodules. A submodule may include one or more photovoltaic cells.

Each photovoltaic cell is intended to convert solar energy into electrical energy.

A converter, for example an inverter 10, including a plurality of switching arms based on transistors, is intended to convert a DC voltage supplied by each string of modules into an AC voltage.

Control means, integrated or not integrated into the converter, are able to control the inverter so as to perform the voltage conversion.

Each module advantageously includes non-return diodes (not shown) positioned in an appropriate manner, for example in series with the modules of each string.

Each module advantageously includes what are called bypass diodes, each for bypassing a module and/or a submodule of separate cells of a module if one or more cells were to be faulty. In FIG. 1, one bypass diode is shown per module (the diodes are referenced D1, D2, D3, D10, D20, D30 in FIG. 1).

Figure 2:
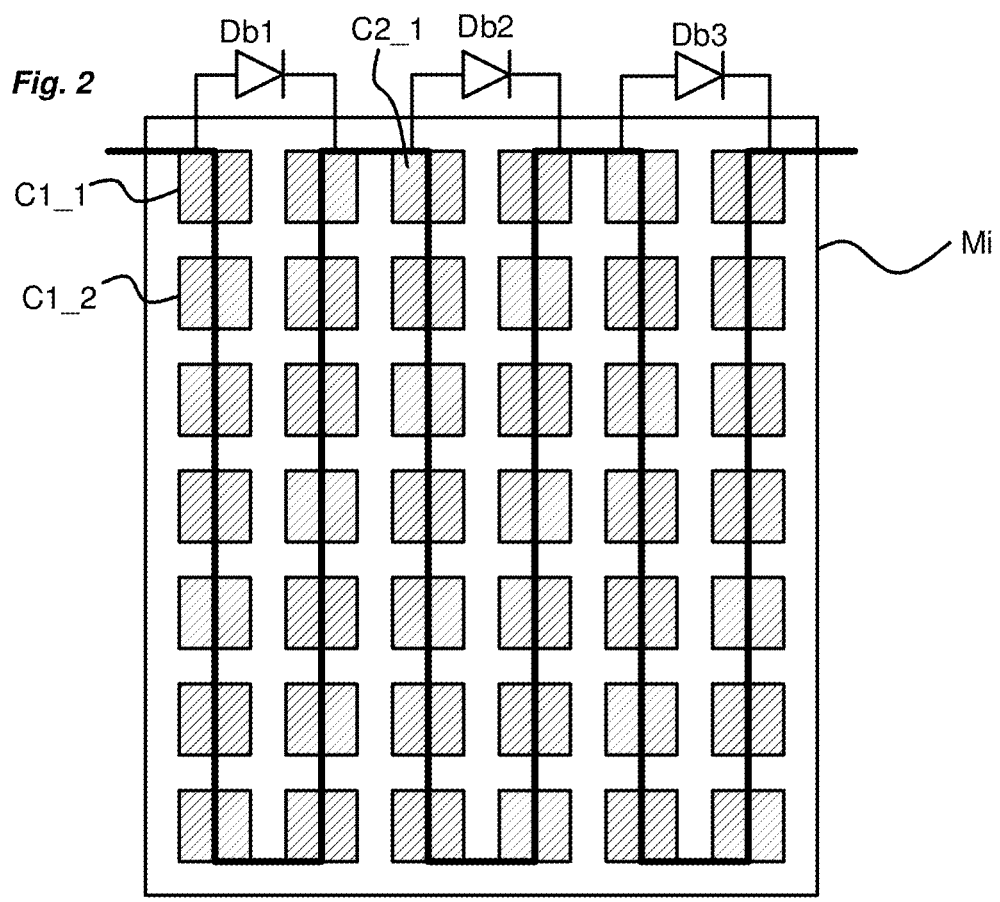
FIG. 2 schematically shows a photovoltaic module on the side of its front face.

With reference to FIG. 2, in each module Mi, the following layout is present:

The photovoltaic cells are organized into a plurality of submodules. In FIG. 2, two columns of cells form a submodule. In this figure, the cell referenced C1_1 corresponds to the first cell of the first row and the cell referenced C1_2 corresponds to the second cell of the first row. The cell referenced C2_1 corresponds to the first cell of the second row.

In FIG. 2, a separate bypass diode Db1, Db2, Db3 is associated with each submodule shown. In FIG. 2, a submodule is shown with a plurality of cells, but it could include just a single cell. The bypass diode is intended to bypass the submodule in the event of a failure of one or more cells in the submodule.

Figure 3:
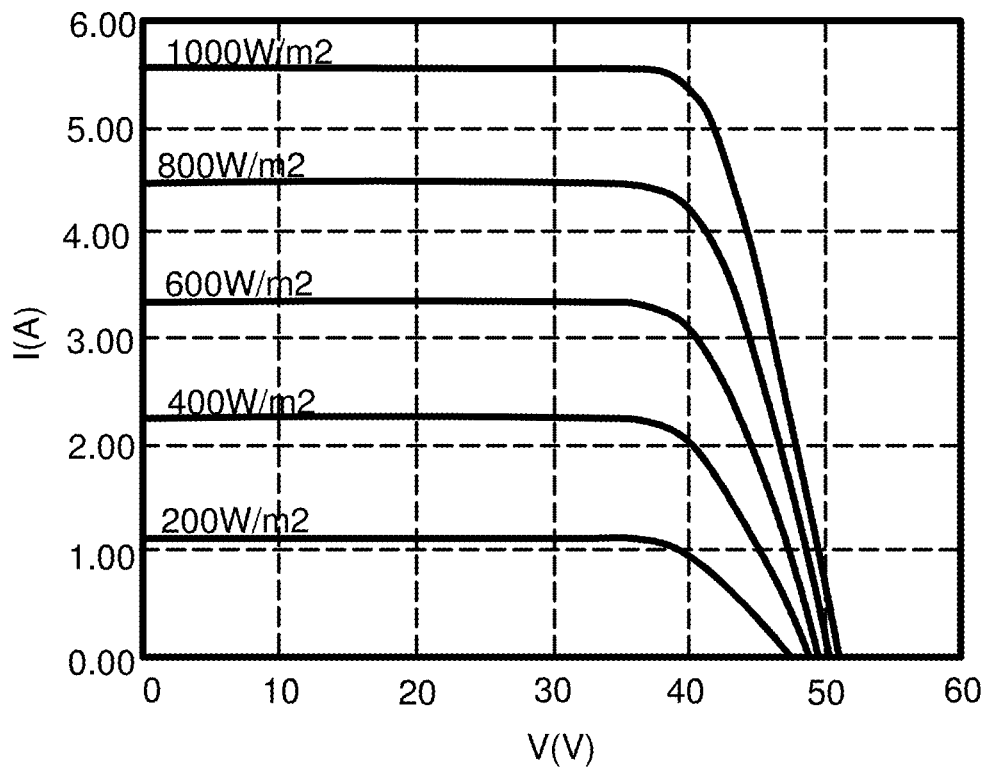
FIG. 3 schematically shows the I-V curves of a photovoltaic module for a plurality of levels of irradiance.

As explained above, the performance of a photovoltaic module Mi is characterized by a set of current-voltage curves, hereinafter termed I-V curves. FIG. 3 shows the reference characteristic I-V curves of a photovoltaic module for various levels of insolation, called irradiance or radiation and expressed in $W/m^2$.

The total voltage of a string of photovoltaic modules is given by the sum of the voltages across the terminals of each module (including those across the terminals of the cables and connectors). The voltages may be different across the terminals of each module if the modules have separate I-V characteristics. By contrast, even if the modules M1 to M3 of the string Ch1 have different I-V characteristics, the operation of the string will be such that the current of the string flowing through each module Mi of the string remains the same. If a module is defective and is not able to channel this current, one or more bypass diodes (Db) allow the additional current, which the cells of the module are not able to channel, to flow. The total current supplied by the architecture is the sum of the currents flowing through each string of the architecture.

Figure 4:
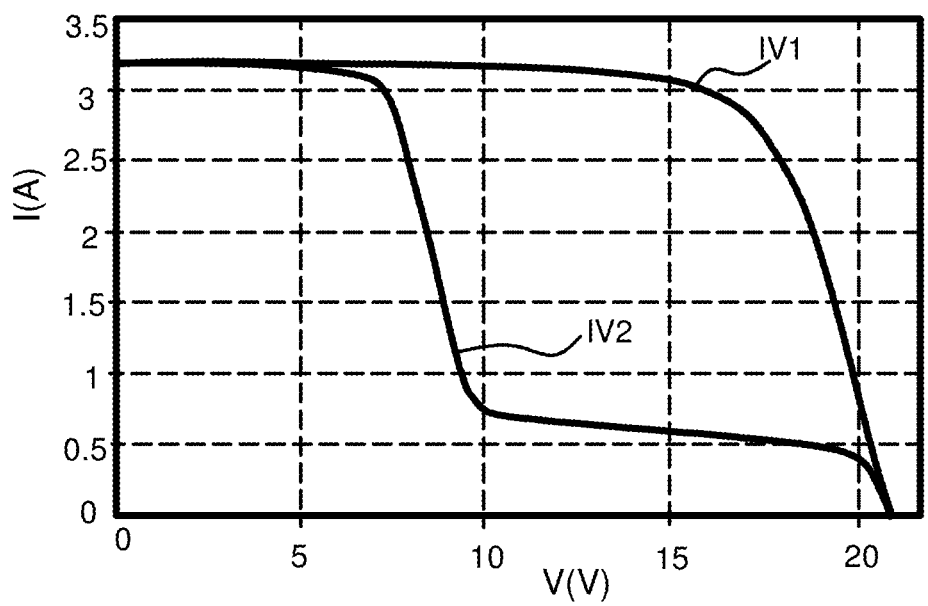
FIG. 4 shows, for one and the same level of irradiance on a photovoltaic module, two characteristic I-V curves of a photovoltaic device, without a fault and with a fault, respectively.

FIG. 4 shows, for one and the same photovoltaic module Mi, the I-V curve, referenced IV1, obtained when this module is healthy and the I-V curve, referenced IV2, obtained when the module is defective.

The importance of monitoring the operating state of the modules Mi of a photovoltaic architecture and of putting in place a method that is able easily to electrically characterize a photovoltaic module by way of its I-V curve for the purpose of detecting a fault is thus understood.

There are various types of possible faults on a photovoltaic module included in a string of modules. Some faults that are conventionally encountered are listed non-exhaustively below:

A photovoltaic module that is hotter than the other modules of the string;

A submodule that is hotter than the other submodules of the photovoltaic module;

A plurality of isolated photovoltaic cells are hotter than the other cells of the photovoltaic module (mosaic);

A plurality of photovoltaic cells situated at the bottom of the module are hotter than the photovoltaic cells situated at the top of the photovoltaic module;

A single photovoltaic cell is hotter than the other photovoltaic cells of the module;

Part of a photovoltaic cell is hotter than normal;

Hotspot on the photovoltaic module;

A submodule is hotter than the other submodules of the module.

The principle of the invention is based on the estimation of the I-V curve of each photovoltaic cell of a photovoltaic module, based almost solely on the temperature of the photovoltaic cell. A system for the electrical characterization of each photovoltaic cell is thus implemented.

The method for the electrical characterization of each photovoltaic cell of a photovoltaic module is implemented by following a plurality of successive steps. It will be seen that some of these steps have to be implemented prior to other ones.

Figure 7:
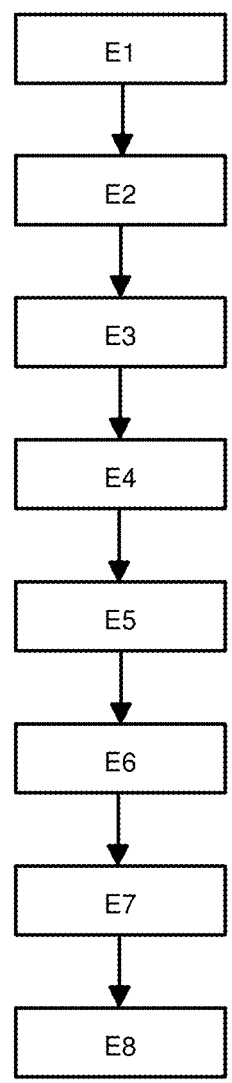
FIG. 7 shows a diagram illustrating an exemplary algorithm implemented in the context of the method of the invention for electrically characterizing a photovoltaic cell of a photovoltaic module.

In a non-limiting manner, these steps, 8 of them in number, are described below in connection with FIG. 7. To implement each of the steps, an electrical characterization system is used. This system includes a processing unit 3. The processing unit includes at least one microprocessor 30, storage means. It also includes a communication module 31 allowing it to communicate, via wired and/or wireless links, with external sensor units. It also includes other means or modules, which will be described hereinafter, for implementing each step.

The principle of the invention is also based on the use of a database D_IV storing I-V curves. Laboratory measurements (of "flash test" type) make it possible to determine I-V curves for various levels of irradiance and of temperature. Moreover, manufacturer datasheets may make it possible to add to and to refine the results obtained in the laboratory. Storage means (of remote or local server type for example) make it possible to store a set of I-V curves based on these tests. In the database, each I-V curve is associated with an irradiance value and with a temperature of the irradiated photovoltaic zone. To determine the I-V curve of a faulty photovoltaic cell, however, it will be necessary to distinguish between several operating scenarios. These various operating scenarios will be explained hereinafter. It will be considered, without limitation, that the database D_IV is stored in the storage means of the processing unit 3.

To describe the steps below, consideration will be given to a photovoltaic architecture that includes:
  A string of photovoltaic modules;
  The string of photovoltaic modules includes at least two photovoltaic modules;
  Each photovoltaic module includes a plurality of photovoltaic cells;
  In each module, the photovoltaic cells are organized into a plurality of submodules, a submodule including one or more photovoltaic cells bypassed by at least one bypass diode.

Figure 5:
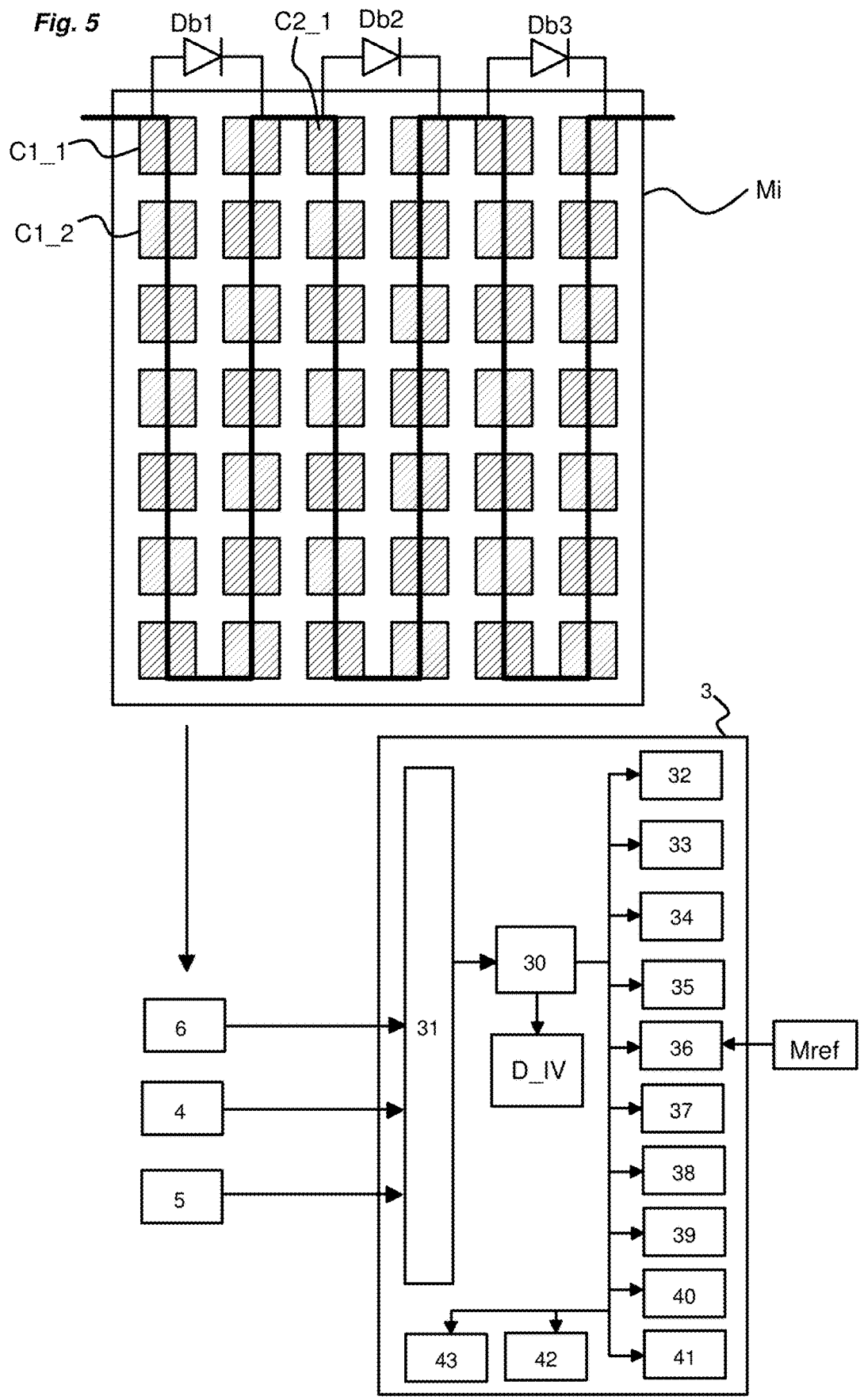
FIG. 5 schematically shows the structure of the electrical characterization system of the invention.

Step E1—Measuring the Temperature of Each Photovoltaic Cell within Each Photovoltaic Module With reference to FIG. 5, the electrical characterization system includes means 6 for acquiring data representative of temperature values on the photovoltaic module during operation.

The acquisition means that are used are connected to the processing unit 3, via its communication module 31, so as to send said temperature data (the image Img or the temperatures originating from the sensors). Any wired or wireless connection solution may be contemplated.

Figure 6A:
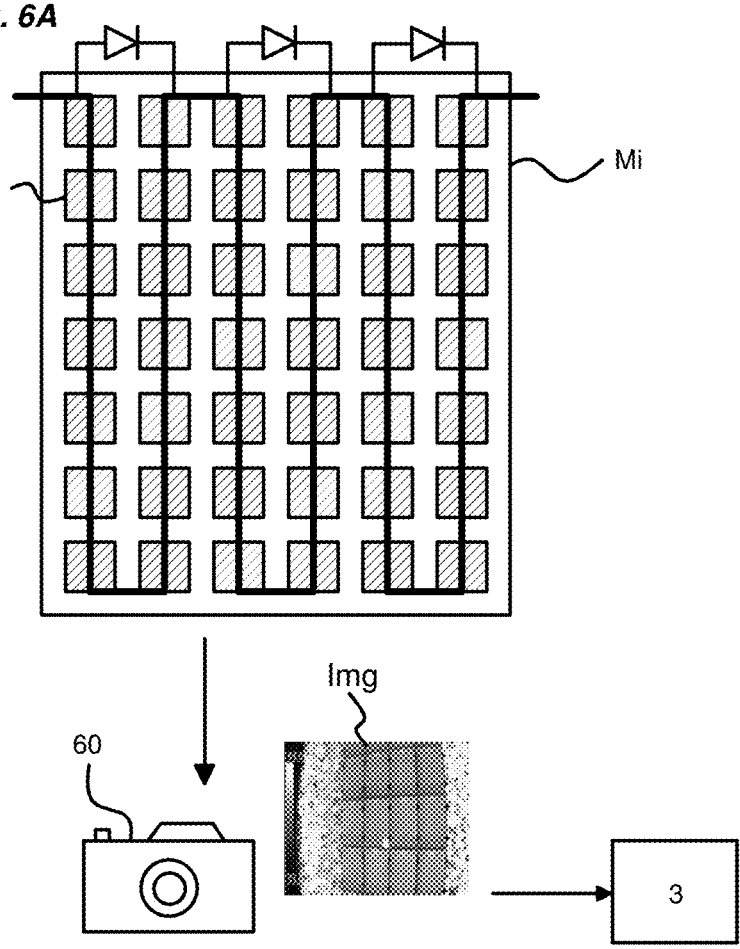
FIGS. 6A and 6B illustrate two modes for acquiring the temperature on a photovoltaic module, using a temperature sensor and/or thermal camera on the module.

With reference to FIG. 6A, these acquisition means may be a thermal camera 60 intended to take a thermal image Img of the surface of the monitored photovoltaic module.

The thermal camera 60 may be combined with the processing unit 3 in one and the same housing.

In FIG. 6A, a thermal camera is shown and supplies a thermal image Img of the module to the central unit 3. The camera may be carried by an operator or installed on a drone that is intended to fly over the photovoltaic installation.

Figure 6B:
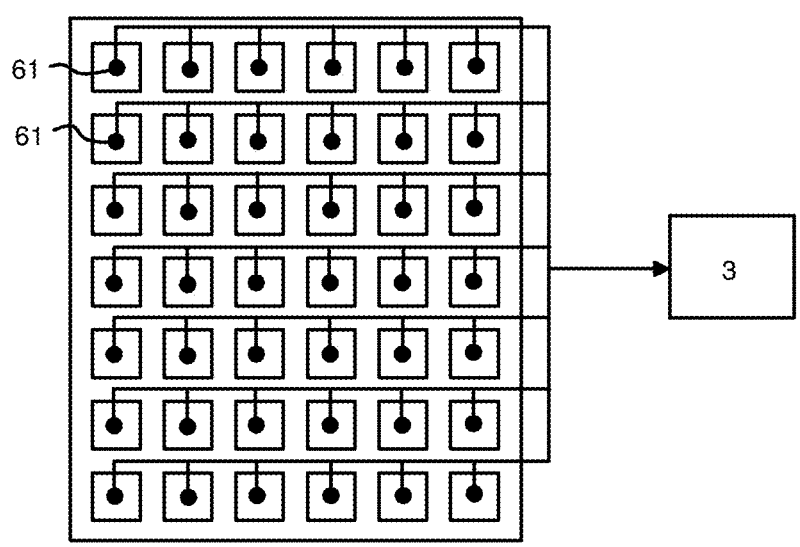

With reference to FIG. 6B, the acquisition means 6 may be temperature measurement devices 61 that are distributed on each cell or on a set of photovoltaic cells of the monitored module and positioned appropriately.

A temperature measurement device may include:
  An analogue or digital temperature sensor positioned as close as possible to the cell;
  Analogue-to-digital conversion means for converting the analogue signal supplied by the sensor, if the latter is analogue;
  A communication interface designed to transmit the measurement data to a processing unit;
  An electric power supply module for supplying power to the device.

The conversion means, the communication interface and the power supply module may be common to a plurality of devices.

The various components of the temperature measurement devices may be organized into a plurality of configurations. Each temperature sensor is located as close as possible to a cell, so as to accurately sense the temperature of the cell, while the other components of the device may be remote from the sensor.

In a non-limiting manner, each temperature sensor may be arranged in different configurations:
  It may be fixed on the rear face of the cell (as in FIG. 6B), or
  It may be encapsulated in the module, so as to be positioned between cells and held between the two faces of a module.

In a non-limiting manner, each temperature sensor will take the form for example of a PT100 platinum resistance temperature detector (RTD) having an accuracy of at least 0.1° C. over a temperature range of from 0° C. to 100° C.

The temperature measurements on a plurality of cells are advantageously synchronized with one another. Any known synchronization method may be used for this purpose. Said method will be implemented by the processing unit UC of the system.

Any other solution for measuring or acquiring the temperatures of the cells could be used.

The processing unit 3 may include a module 32 for dividing or for breaking down a thermal image Img received from a thermal camera 60. This module is executed upon request by the microprocessor 30 when a thermal image has been acquired from the thermal camera.

The division may consist in breaking the thermal image down into a plurality of zones. This is achieved by image processing implemented by the processing unit. Each temperature zone is characterized by its own temperature that is uniform or virtually uniform over the entire zone. Two adjacent thermal zones have a sufficient temperature difference between them, for example greater than a certain threshold (for example 10° C.). Virtually uniform is intended to mean that the temperature may vary from one spot to another in the thermal zone, but that the temperature difference between two spots of one and the same zone still remains below said threshold. A determined temperature representative of the temperature of the zone is then associated with each thermal zone. This temperature, assigned to each zone, may be an average temperature determined from all of the temperatures of the zone.

Of course, the same division into a plurality of thermal zones may be achieved using data supplied by the temperature sensors.

The processing unit 3 may include a module 33 for determining the respective surface areas of the various divided thermal zones.

The processing unit 3 may include a module 34 for determining a matrix of temperatures, the matrix of temperatures consisting, after the monitored module has been divided into a plurality of zones, in assigning a temperature to each zone. This matrix is obtained regardless of the acquisition means that are used. If temperature measurement devices are used, creating the temperature matrix consists in directly assigning, to each cell, its respective measured temperature. The matrix is updated regularly, for example periodically, in order to monitor the change in the temperature of each photovoltaic cell.

Step E2—Analysing the Acquired Temperatures in Order to Identify the State of Each Photovoltaic Cell The processing unit 3 may include a module 35 for detecting the state of each photovoltaic cell of the module between a healthy state or a faulty state.

A photovoltaic cell will be considered to be in a healthy state when its temperature is substantially equal to what is called a reference temperature. The temperature of a cell in a healthy state will be denoted $T_{healthy}$.

This will thus give:

$$T_{healthy}=T_{ref}$$

A photovoltaic cell will be considered to be in a faulty state when its temperature exceeds a certain threshold. This threshold will be equal for example to the reference temperature plus a temperature delta.

The temperature $T_{cell\_k}$ of a faulty cell k will thus be defined by:

$$T_{cell\_k} > T_{ref} + \Delta T$$

Where $\Delta T$ corresponds to a temperature difference greater than a minimum value $\Delta T_{min}$ (for example equal to 2° C.).

The processing unit 3 may include a module 36 for obtaining the reference temperature Tref from a module designated as reference module Mref.

The reference temperature Tref is the temperature of a reference module Mref considered to be healthy, that is to say without an operating fault. The reference module Mref is a photovoltaic module analogous to the monitored photovoltaic module (that is to say having the same technical features) but that is not defective. It is advantageously present in the same photovoltaic architecture as the monitored module. The reference temperature may be obtained in a manner identical to that used for the monitored module, that is to say from a thermal image of the module and/or from temperature measurement devices. The temperature data of the reference module may be sent to the processing unit 3, which may then calculate the reference temperature using the appropriate module 36. This reference temperature Tref may correspond to the average temperature of the reference module Mref.

Step E3—Estimating the Additional Thermal Losses Caused by Each Faulty Photovoltaic Cell The processing unit 3 may include a module 37 for estimating the additional thermal losses of a module, caused by the presence of a faulty cell in the module.

For a cell, these thermal losses are expressed by the following relationship:

$$\Delta P_{th\_cell-k} = U_{pv} \times (T_{cell\_k} - T_{healthy})$$

In which:
- $\Delta P_{th\_cell\_k}$ corresponds to the additional thermal losses created;
- $U_{pv}$ represents the heat-exchange coefficient of the module;
- $T_{cell\_k}$ corresponds to the temperature of the faulty cell;
- $T_{healthy}$ corresponds to the temperature of a healthy cell.

This relationship is detailed in particular in patent application WO2016/189052A1, which is hereby incorporated by reference.

Step E4—Calculating the Radiation Received in the Plane of Each Photovoltaic Module The system may optionally include a device 5 for measuring the irradiance. This device is then configured to communicate with the processing unit via the communication module 31.

As a substitution or in addition, the processing unit 3 may include a module 38 for determining the irradiance received by the module. This module may be based on one or more of the following methods, or on any other possible method:
- Measurement using an irradiance measurement device 5 present on the site of the photovoltaic installation;
- Recovery of various data, such as the geographical position of the installation, the orientation and inclination of the modules, the environment, the date, the time, weather data;
- Recovery of satellite data.

The irradiance determined by one of these methods is denoted $G_{healthy}$ hereinafter.

Step E5—Estimating the I-V Curve of Each Healthy Cell

The processing unit 3 includes a module 39 for estimating the I-V curve of each healthy cell of a photovoltaic module. When it is executed, this module 39 draws on the database of available I-V curves.

Each of the photovoltaic cells that has been declared to be in a healthy state by the detection module 35 has a temperature equal to $T_{healthy}$. Furthermore, they are therefore inevitably subjected to a radiation equal to $G_{healthy}$.

With knowledge of $T_{healthy}$ and $G_{healthy}$, the estimation module 39 searches, in the database of the I-V curves, for the I-V curve corresponding to these operating conditions.

Starting from this I-V curve, a specific module 40 of the processing unit 3 is able to identify the values of the current $I_{mpp}$ and $V_{mpp}$. These values are useful to the module for estimating the ambient temperature for the purpose of determining the value of the ambient temperature $T_a$ using the rationale described hereinafter.

Step E6—Estimating the Ambient Temperature

The system may include a device 4 for measuring the ambient temperature, which device is connected to the processing unit 3 via the communication module 31.

As a substitution or in addition, the processing unit 3 may include a module 41 for estimating the ambient temperature (for example if the ambient temperature sensor is absent). This module applies the following method:

We have:

$$P_{elec\_healthy} = I_{mpp} \times V_{mpp}$$

$$G_{healthy} = P_{th\_healthy} + P_{elec\_healthy}$$

$$P_{th\_healthy} = U_{th} \times (T_{healthy} - T_a)$$

We then obtain:

$$T_a = T_{healthy} - \frac{(G_{healthy} - P_{elec\_healthy})}{U_{th}}$$

Where:
- $P_{elec\_healthy}$ corresponds to the electric power supplied by a healthy cell;
- $I_{mpp}$ corresponds to the current at the maximum power point;
- $V_{mpp}$ corresponds to the voltage at the maximum power point;
- $P_{th\_healthy}$ corresponds to the thermal power output by a healthy cell;
- $T_{healthy}$ corresponds to the temperature of a healthy cell;
- $T_a$ corresponds to the desired ambient temperature;
- $G_{healthy}$ represents the irradiance received by the module, that is to say the power of the luminous flux irradiating the reference photovoltaic module (therefore the healthy module).

Step E7—Estimating the Thermal Power Dissipated by Each Faulty Photovoltaic Cell The processing unit 3 may include a module 42 for estimating the thermal power dissipated by each faulty cell. This power is expressed by the following relationship:

$$P_{th\_cell\_k} = U_{th} \times (T_{cell\_k} - T_a)$$

In which:
- $P_{th\_cell\_k}$ corresponds to the thermal power dissipated by a faulty cell k of the module;
- $U_{th}$ corresponds to the heat-exchange coefficient of the module;
- $T_a$ corresponds to the ambient temperature.

Step E8—Estimating the I-V Curve of Each Faulty Photovoltaic Cell

The processing unit 3 includes a module 43 for estimating the I-V curve of each faulty cell k of a photovoltaic module.

Figure 8:
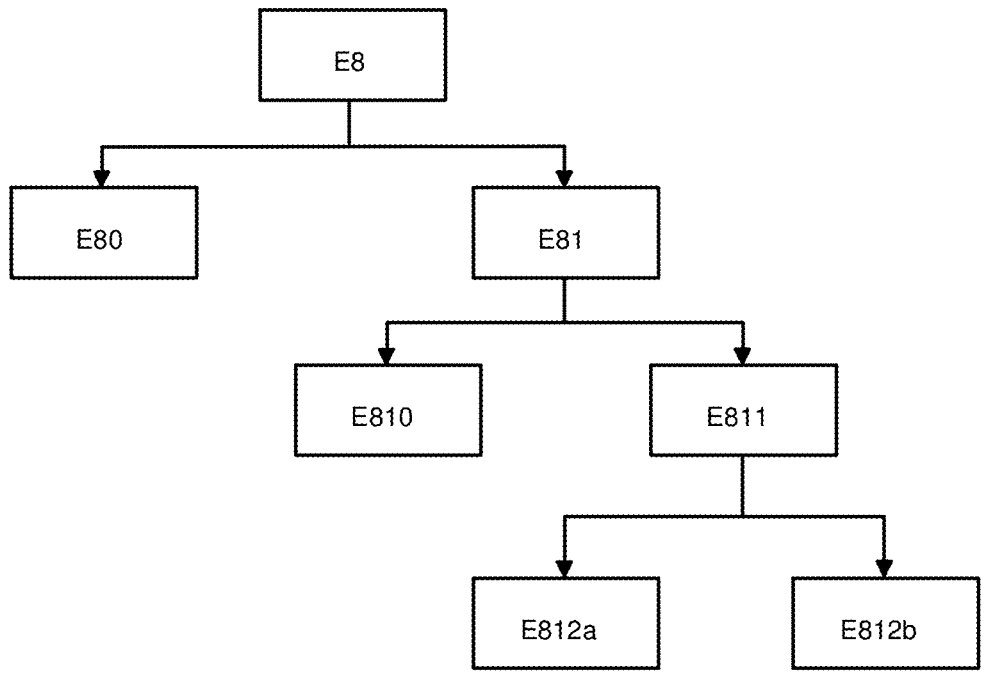
FIG. 8 shows a diagram detailing one of the steps of the method of the invention.

This estimation module 43 applies the algorithm described below. This algorithm consists in defining the situation, taking into account the state of the various cells and the situation of each faulty cell within the string of modules and within its submodule. FIGS. 8 to 10 precisely illustrate the various steps that are implemented and the various operating scenarios to be taken into account.

The estimation module 43 applies a first test module in order to check whether the string of photovoltaic modules is entirely faulty, that is to say that it does not include any photovoltaic cells whose temperature is equal to $T_{healthy}$ (step E80) or whether the string is not entirely faulty, and that it includes at least one healthy cell whose temperature is equal to $T_{healthy}$ (step E81).

A. First Operating Scenario—E80

In this first operating scenario, the string of photovoltaic modules monitored does not include any healthy photovoltaic cells, that is to say no photovoltaic cells whose temperature is equal to $T_{healthy}$.

This scenario is explained by the string of photovoltaic modules not being connected to the inverter, or by a straightforward short-circuit or open-circuit fault (for example at the connection between two modules).

In this scenario, each photovoltaic cell of the photovoltaic module may be characterized by an I-V curve equivalent to that of a healthy cell, as the cells are not directly at issue.

B. Second Operating Scenario—E81

In this second operating scenario, the string of photovoltaic modules includes at least one faulty cell k and at least one healthy photovoltaic cell, that is to say whose temperature is equal to $T_{healthy}$.

Figure 9A:
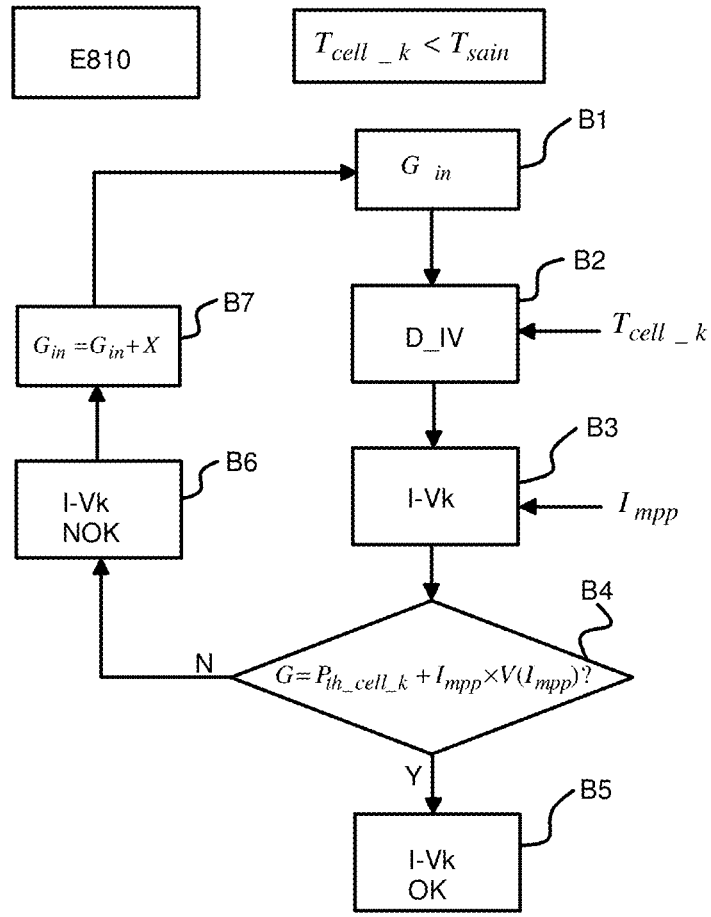
FIG. 9A shows a diagram illustrating a first operating scenario in the method of the invention.
Figure 10:
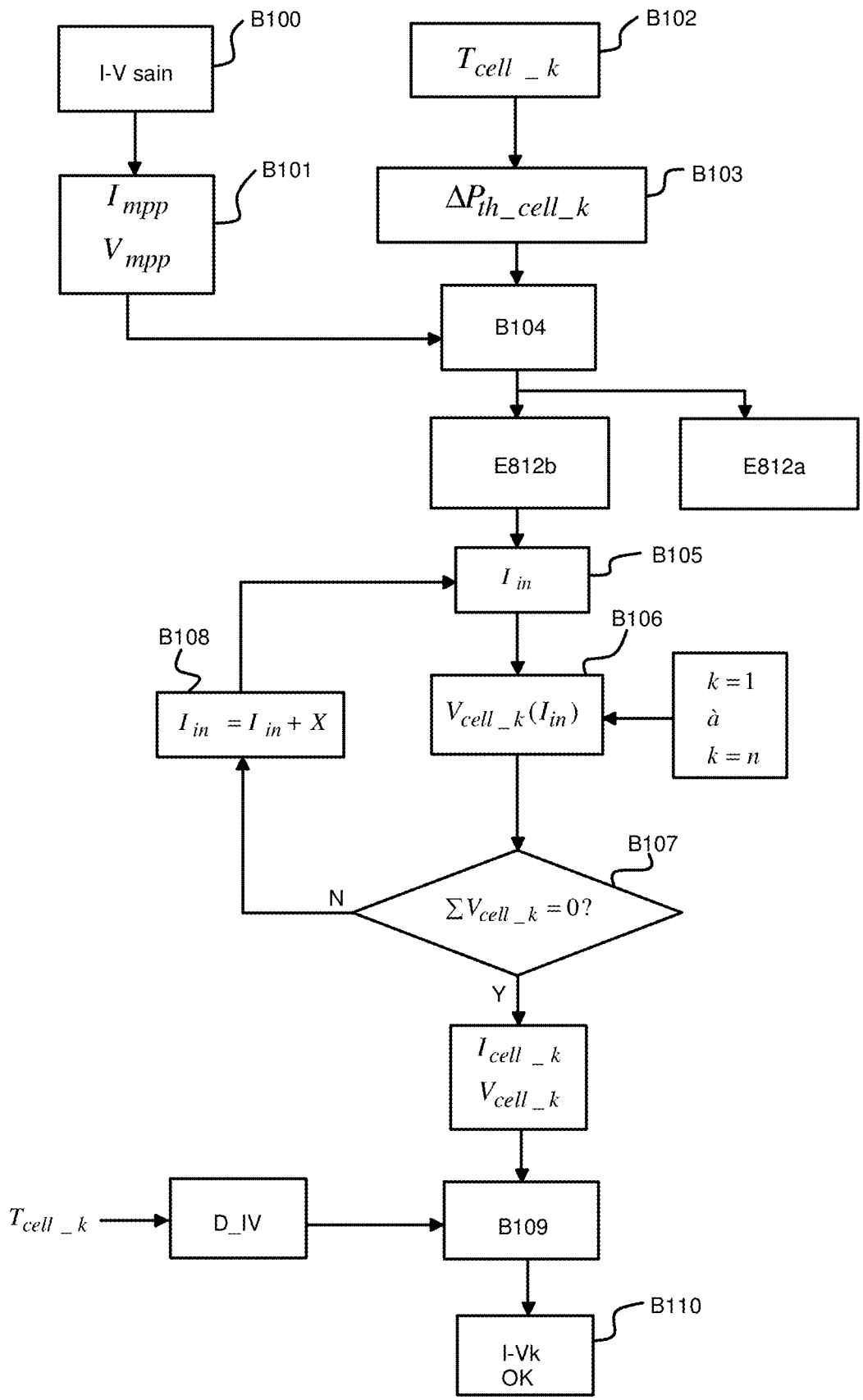
FIG. 10 shows a diagram illustrating a third operating scenario in the method of the invention.

This second operating scenario may be split into two operating sub-scenarios:

a) A first operating sub-scenario (E810) in which the faulty photovoltaic cell k is accompanied, in its submodule, by at least one healthy photovoltaic cell whose temperature is equal to $T_{healthy}$.

b) A second operating sub-scenario (E811) in which the faulty photovoltaic cell k is not accompanied, in its submodule, by any healthy photovoltaic cells, that is to say by any photovoltaic cells whose temperature is equal to $T_{healthy}$.

a) In the first operating sub-scenario (E810), for the cell k in the submodule that is faulty and whose temperature $T_{cell\_k}$ is different from $T_{healthy}$, we have:
- The current $I_{cell\_k}$ flowing through the cell k is identical to $I_{mpp}$ since the photovoltaic cells are in series in the submodule;

With reference to FIG. 9A, if $T_{cell\_k} < T_{healthy}$, it may be concluded therefrom that:

The photovoltaic cell k is shaded and is therefore at an irradiance $G_{cell\_k}$;

The thermal power dissipated by the faulty cell k then has the value:

$$P_{th\_cell\_k} = G_{cell\_k} - I_{mpp} \times V_{cell\_k}$$

Where:
- $P_{th\_cell\_k}$ is the thermal power supplied by the faulty cell k, this value being known from the relationship defined above in step 7: $P_{th\_cell\_k} = U_{th} \times (T_{cell\_k} - T_a)$;
- $I_{mpp}$ is the current at the maximum power point, which is also known by way of the implementation of step 5 above.

It is then a question of implementing a recognition loop, as shown in FIG. 9A. The loop consists in:
- Taking a value (denoted $G_{in}$) between 0 and $G_{healthy}$ (block B1) for the irradiance G;
- Searching, in the database D_IV of I-V curves, for the curve that corresponds to the value of $G_{in}$ chosen at input and to the known value of $T_{cell\_k}$ (block B2);
- Finding the sought-after I-V curve (block B3) in the database D_IV;
- On the basis of the selected curve, it is then a question of deducing therefrom the value of V that corresponds to the known value of $I_{mpp}$;
- Lastly, it involves checking whether the data of $G_{in}$ and V make it possible to satisfy the following relationship (block B4):

$$G = G_{cell\_k} = P_{th\_cell\_k} + I_{mpp} \times V(I_{mpp})$$

Where $P_{th\_cell\_k}$ and $I_{mpp}$ are moreover known;
- If the relationship is satisfied (branch Y), the I-V curve that has been selected is retained (block B5);
- If the relationship is not satisfied (branch N), the curve selected in the database D_IV is not correct (block B6) and the loop is restarted starting from a new value $G_{in}$ assigned to G (block B7). The loop is stopped with the above relationship is satisfied.

Figure 9B:
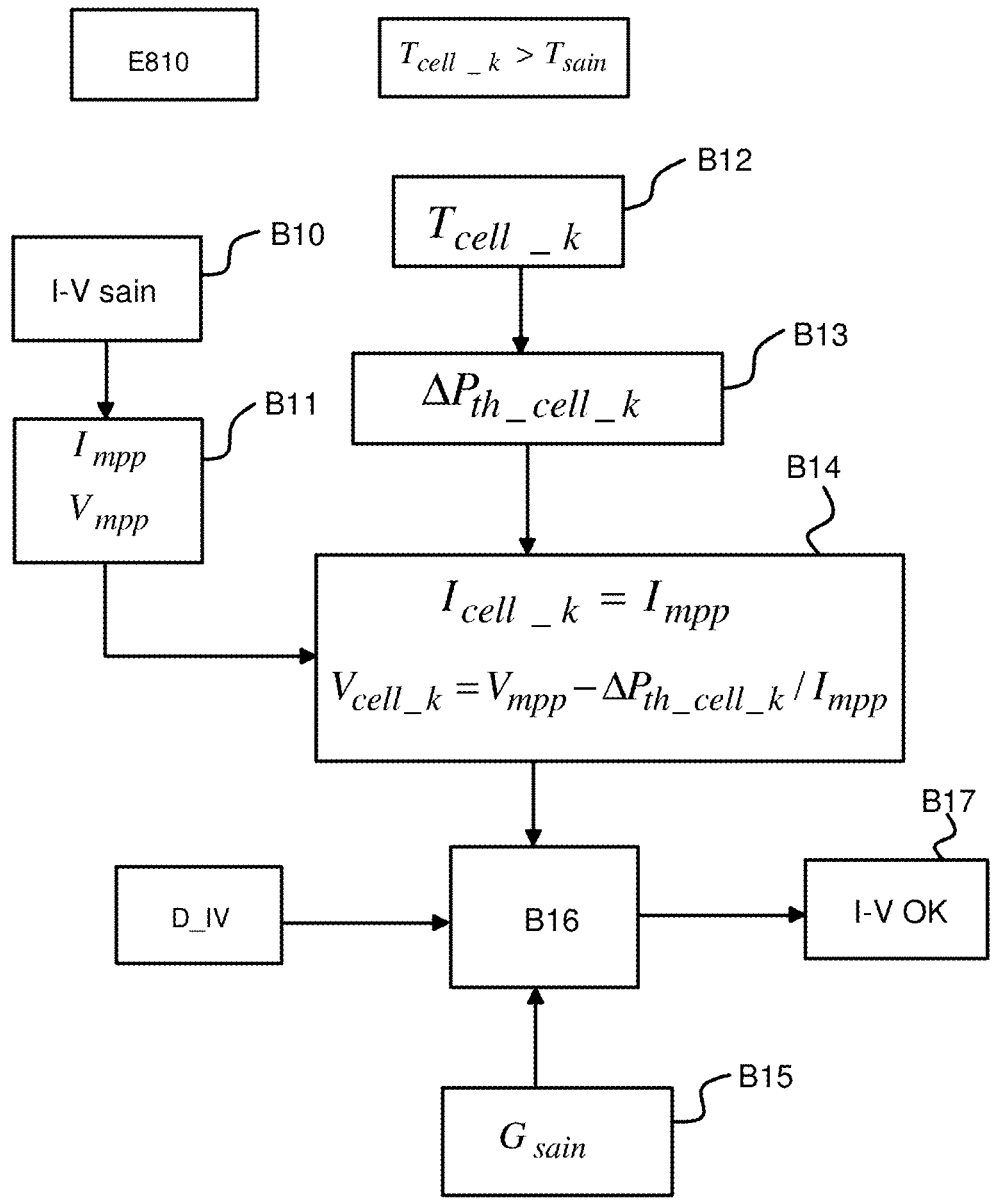
FIG. 9B shows a diagram illustrating a second operating scenario in the method of the invention.

With reference to FIG. 9B, if $T_{cell\_k} > T_{healthy}$, it may be concluded therefrom that:
- For each healthy cell present in the submodule, the I-V curve corresponds to the curve for which the temperature is equal to $T_{healthy}$ and for which the irradiance is equal to $G_{healthy}$ (block B10);
- On the basis of the I-V curve of a healthy cell in the submodule, it is possible to deduce $I_{mpp}$ and $V_{mpp}$ directly therefrom (block B11);
- The faulty cell k is at the temperature $T_{cell\_k}$ (block B12);
- The additional thermal losses brought about by this faulty cell k are determined in step E3 described above and are expressed by the relationship (block B13):

$$\Delta P_{th\_cell\_k} = U_{pv} \times (T_{cell\_k} - T_{healthy})$$

- On the basis of the above data, the voltage of the faulty cell k has the value: $V_{cell\_k} = V_{mpp} - \Delta P_{th\_cell\_k} I_{mpp}$ (block B14);
- The photovoltaic cell receives a radiation $G_{cell\_k} = G_{healthy}$ identical to that of the healthy cell (block B15);
- The estimation module 43 searches (block B16), in the database D_IV of I-V curves, for the corresponding curve (block B16);
- The I-V curve of the faulty cell k is therefore the curve present in the database for which the temperature $T = T_{cell\_k}$ and for which the point defined by $I_{cell\_k}$ and $V_{cell\_k}$ belongs to the curve (block B17).

b) In the second operating sub-scenario (E811), the submodule does not include any healthy photovoltaic cells, that is to say no cells whose temperature is equal to $T_{sain}$. However, the estimation module 43 has the following information:

If the cell were healthy, its I-V curve would correspond to the curve for which the temperature is equal to $T_{healthy}$ and for which the irradiance is equal to $G_{healthy}$ (block B100);

On the basis of the I-V curve of a healthy cell, it is possible to deduce $I_{mpp}$ and $V_{mpp}$ directly therefrom (block B101);

The faulty cell k is at the temperature $T_{cell\_k}$ (block B102);

Each faulty cell k then generates thermal losses in accordance with the relationship (block B103):

$$\Delta P_{th\_cell\_k} = U_{pv} \times (T_{cell\_k} - T_{healthy})$$

The total voltage of the submodule is zero, that is to say $\Sigma_1^n V_{cell\_k} = 0$ because the bypass diode of the submodule has been activated;

The photovoltaic cells of the submodule are flowed through by an identical current;

Each power point defined by $I_{cell\_k}$ and $V_{cell\_k}$ is situated on an I-V curve such that (block B104):

$$I_k(V) = (P_{elec\_healthy} - \Delta P_{th\_cell\_k})/V \text{ or } V_k(I) = (P_{elec\_healthy} - \Delta P_{th\_cell\_k})/I$$

For a given cell, if $P_{elec} = P_{elec\_healthy} - \Delta P_{th_{cell_k}} = 0$, that is to say that the photovoltaic cell is short-circuited in an open circuit, then its I-V curve corresponds to all of the points situated on the two half-axes $\{(I,V) \text{ such that } I \geq 0 \text{ and } V=0\}$ and $\{(I,V) \text{ such that } I=0 \text{ and } V \geq 0\}$.

However, two separate scenarios (E812a, E812b) may then be identified:

1) In the first scenario (E812a), all of the cells of the submodule each supply zero electric power, that is to say that:

$$P_{elec} = P_{elec\_healthy} - \Delta P_{th\_cell\_k} = 0$$

On the scale of each photovoltaic cell, each cell is definitely healthy and therefore has an I-V curve equivalent to that of a healthy cell.

On the scale of the submodule, the I-V curve is defined as the set of points situated on the two half-axes $\{(I,V)$ such that $I \geq 0$ and $V=0\}$ and $\{(I,V)$ such that $I=0$ and $V \geq 0\}$.

2) In the second scenario (E812b), at least one photovoltaic cell of the submodule supplies a nonzero electric power, that is to say that, for this cell, we have:

$$P_{elec} = P_{elec\_healthy} - \Delta P_{th_{cell_k}} \neq 0$$

In this situation, with reference to FIG. 10, the estimation module implements the following loop:

It sets one and the same current value $I_{in}$ (block B105) for all of the faulty cells of the submodule (the current being identical in all of these cells);

It determines, for each faulty cell k of the submodule, a corresponding voltage value $V_{cell\_k}$ on the basis of the relationship $V_{cell\_k}(I_{in}) = (P_{healthy} - \Delta P_{th\_cell\_k})/I_{in}$ For the n cells k of the submodule (where k ranges from 1 to n), it obtains a particular voltage value $V_{cell\_k}$ (block B106);

It then checks whether $\Sigma_1^n V_{cell\_k} = 0$ (block B107);

If the relationship is not satisfied (branch N), it restarts the loop while modifying the value of the current $I_{in}$ applied at input (block B108). The current is for example chosen from a range of from $I_{mpp}$ (for a healthy cell) to 0.

If the relationship is satisfied (branch Y), it searches (block B109), in the database D_IV of I-V curves, for each faulty cell k in the submodule, for the curve that corresponds to the temperature $T_{cell\_k}$ and to which the point having coordinates ($I_{cell\_k}$; $V_{cell\_k}$) that has been determined belongs;

The I-V curve is then obtained for each faulty cell k in the submodule (block B110).

On the basis of the complete algorithm elaborated above, the processing unit 3 is able to estimate the I-V curve of a faulty photovoltaic cell in a photovoltaic module, simply from a measurement of its temperature and by referring to the database of I-V curves.

The solution of the invention is therefore particularly easy to implement, reliable and inexpensive. The database D_IV is very often already available and is easily able to be exploited.

The invention claimed is:

1. A method for the electrical characterization of a photovoltaic cell of a photovoltaic module, said photovoltaic module including a plurality of photovoltaic cells connected to one another and one or more bypass diodes, each bypass diode being configured to bypass a submodule formed of one or more photovoltaic cells of said photovoltaic module, comprising the steps of:
    obtaining the irradiance received by said photovoltaic module,
    obtaining a temperature of each photovoltaic cell of a first submodule of said photovoltaic module,
    comparing said temperature obtained for each photovoltaic cell of the first submodule with a reference temperature,
    determining the state of each photovoltaic cell of the first submodule between a healthy state, in which its temperature is equal to the reference temperature, and a faulty state, in which its temperature is different from said reference temperature,
    estimating the I-V curve associated with a first photovoltaic cell of said first submodule, by searching in a database of I-V curves, taking into account:
    the healthy state or the faulty state of said first photovoltaic cell;
    the healthy state or the faulty state of all of the other photovoltaic cells of the first submodule;
    the electric power supplied by each photovoltaic cell of the first submodule.

2. The method according to claim 1, wherein:
    if the first photovoltaic cell is in said faulty state, it comprises a step of:
    determining whether the first photovoltaic cell belongs to a string of modules in which all of the photovoltaic cells are in the faulty state or whether the first photovoltaic cell belongs to a string of modules in which at least one photovoltaic cell is in a healthy state.

3. The method according to claim 2, wherein:
    if the first photovoltaic cell belongs to a string of modules in which at least one photovoltaic cell is in a healthy state, it includes a step of:
    determining whether the first photovoltaic cell belongs to a submodule that includes at least one cell in the healthy state or to a submodule that does not include any cells in the healthy state.

4. The method according to claim 3, wherein:
if the first photovoltaic cell belongs to a submodule that includes at least one cell in the healthy state, it comprises a step of:
comparing the temperature of the first cell with said reference temperature in order to determine whether said temperature of the first cell is higher than said reference temperature or lower than said reference temperature.

5. The method according to claim 4, wherein:
if the temperature of the first photovoltaic cell is lower than the reference temperature, it consists in implementing a loop of searching for the I-V curve associated with said first photovoltaic cell, said search loop comprising:
a step of applying a first irradiance;
a step of determining, in the database of I-V curves, a first I-V curve corresponding to said first irradiance and to said temperature of the first photovoltaic cell;
on the basis of said first curve, a step of determining the voltage that corresponds to the current at the maximum power point;
a step of satisfying the following relationship:

$$G = P_{th\_cell\_k} + I_{mpp} \times V(I_{mpp})$$

wherein:
G corresponds to said first irradiance introduced at input;
$P_{th\_cell\_k}$ corresponds to the thermal power generated by said first photovoltaic cell;
$I_{mpp}$ corresponds to the current at the maximum power point;
$V(I_{mpp})$ corresponds to the voltage determined on said first I-V curve for said current at the maximum power point;
if said relationship is satisfied, said I-V curve is valid;
if said relationship is not satisfied, said loop is restarted while modifying the irradiance value applied at input.

6. The method according to claim 4, wherein:
if the temperature of the first photovoltaic cell is higher than the reference temperature, it comprises:
a step of determining the voltage of the faulty first photovoltaic cell from the following relationship:

$$V_{cell\_k} = V_{mpp} - \Delta P_{th\_cell\_k} / I_{mpp}$$

wherein:
$V_{cell\_k}$ corresponds to the voltage of the first photovoltaic cell;
$V_{mpp}$ corresponds to the voltage at the maximum power point;
$\Delta P_{th\_cell\_k}$ corresponds to the energy losses caused by the faulty first photovoltaic cell;
$I_{mpp}$ corresponds to the current at the maximum power point;
a step of searching, in the database of I-V curves, for the I-V curve that corresponds to a reference irradiance, and for which the point whose coordinates are said voltage determined for the first photovoltaic cell and the current at the maximum power point belongs to the curve.

7. The method according to claim 3, wherein:
if the first photovoltaic cell belongs to a submodule that does not include any cells in the healthy state, it includes a step of:
determining whether all of the cells of its submodule have zero electric power or whether at least one cell of said submodule has a nonzero electric power.

8. The method according to claim 7, wherein:
if all of the cells of its submodule have zero electric power, it includes a step of:
estimating the I-V curve associated with said first photovoltaic cell by searching, in a database of I-V curves, for an I-V curve defined by $\{(I,V)$ such that $I \geq 0$ and $V=0\}$ and $\{(I,V)$ such that $I=0$ and $V \geq 0\}$.

9. The method according to claim 7, wherein:
if at least one cell of said submodule has a nonzero electric power, it consists in implementing a loop of searching for the I-V curve associated with said first photovoltaic cell, said search loop comprising:
a step of applying a first current;
a step of determining, for each photovoltaic cell of said submodule, the voltage of the cell from the following relationship:

$$V_{cell\_k}(I_{in}) = (P_{elec\_healthy} - \Delta P_{th\_cell\_k}) / I_{in}$$

wherein:
$V_{cell\_k}$ corresponds to the voltage of each photovoltaic cell of said submodule, where k=1 to n photovoltaic cells in the submodule;
$I_{in}$ corresponds to said first current applied at input;
$P_{elec\_healthy}$ corresponds to the power supplied by a photovoltaic cell in a healthy state;
$\Delta P_{th\_cell\_k}$ corresponds to the energy losses caused by each faulty photovoltaic cell;
a step of determining the sum of the voltages of all of the photovoltaic cells of the submodule;
a step of checking whether said sum is zero or nonzero;
if said sum is zero:
a step of estimating the I-V curve associated with said first photovoltaic cell by searching, in a database of I-V curves, for an I-V curve for which the point whose coordinates are said voltage determined for the first photovoltaic cell and the first current applied at input belongs to the curve;
if said sum is nonzero;
a step of modifying the first current applied at input and of implementing said search loop again, taking into account the modified first current.

10. A system for the electrical characterization of a photovoltaic cell of a photovoltaic module, said photovoltaic module including a plurality of photovoltaic cells connected to one another and one or more bypass diodes, each bypass diode being configured to bypass a submodule formed of one or more photovoltaic cells of said photovoltaic module, comprising:
a module for obtaining the irradiance received by said photovoltaic module,
a module for obtaining a temperature of each photovoltaic cell of a first submodule of said photovoltaic module,
a module for comparing said temperature obtained for each photovoltaic cell of the first submodule with a reference temperature,
a module for determining the state of each photovoltaic cell of the first submodule between a healthy state, in which its temperature is equal to the reference temperature, and a faulty state, in which its temperature is different from said reference temperature, a module for estimating the I-V curve associated with a first photovoltaic cell of said first submodule, by searching in a database of I-V curves, taking into account:
the healthy state or the faulty state of said first photovoltaic cell;
the healthy state or the faulty state of all of the other photovoltaic cells of the first submodule;

the electric power supplied by each photovoltaic cell of the first submodule.

11. The system according to claim 10, wherein:
if the first photovoltaic cell is in said faulty state, it is configured to execute:
a module for determining whether the first photovoltaic cell belongs to a string of modules in which all of the photovoltaic cells are in the faulty state or whether the first photovoltaic cell belongs to a string of modules in which at least one photovoltaic cell is in a healthy state.

12. The system according to claim 11, wherein:
if the first photovoltaic cell belongs to a string of modules in which at least one photovoltaic cell is in a healthy state, it is configured to execute:
a module for determining whether the first photovoltaic cell belongs to a submodule that includes at least one cell in the healthy state or to a submodule that does not include any cells in the healthy state.

13. The system according to claim 12, wherein:
if the first photovoltaic cell belongs to a submodule that includes at least one cell in the healthy state, it is configured to execute:
a module for comparing the temperature of the first cell with said reference temperature in order to determine whether said temperature of the first cell is higher than said reference temperature or lower than said reference temperature.

14. The system according to claim 13, wherein:
if the temperature of the first photovoltaic cell is lower than the reference temperature, it is configured to execute a loop of searching for the I-V curve associated with said first photovoltaic cell, said search loop comprising:
a step of applying a first irradiance;
a step of determining, in the database of I-V curves, a first I-V curve corresponding to said first irradiance and to said temperature of the first photovoltaic cell;
on the basis of said first curve, a step of determining the voltage that corresponds to the current at the maximum power point;
a step of satisfying the following relationship:

$$G = P_{th\_cell\_k} + I_{mpp} \times V(I_{mpp})$$

wherein:
G corresponds to said first irradiance introduced at input;
$P_{th\_cell\_k}$ corresponds to the thermal power generated by said first photovoltaic cell;
$I_{mpp}$ corresponds to the current at the maximum power point;
$V(I_{mpp})$ corresponds to the voltage determined on said first I-V curve for said current at the maximum power point;
if said relationship is satisfied, said I-V curve is valid;
if said relationship is not satisfied, said loop is restarted while modifying the irradiance value applied at input.

15. The system according to claim 13, wherein:
if the temperature of the first photovoltaic cell is higher than the reference temperature, it is configured to execute:
a module for determining the voltage of the faulty first photovoltaic cell from the following relationship:

$$V_{cell\_k} = V_{mpp} - \Delta P_{th\_cell\_k} / I_{mpp}$$

wherein:
$V_{cell\_k}$ corresponds to the voltage of the first photovoltaic cell;
$V_{mpp}$ corresponds to the voltage at the maximum power point;
$\Delta P_{th\_cell\_k}$ corresponds to the energy losses caused by the faulty first photovoltaic cell;
$I_{mpp}$ corresponds to the current at the maximum power point;
a module for searching, in the database of I-V curves, for the I-V curve that corresponds to a reference irradiance, and for which the point whose coordinates are said voltage determined for the first photovoltaic cell and the current at the maximum power point belongs to the curve.

16. The system according to claim 12, wherein:
if the first photovoltaic cell belongs to a submodule that does not include any cells in the healthy state, it is configured to execute:
a module for determining whether all of the cells of its submodule have zero electric power or whether at least one cell of said submodule has a nonzero electric power.

17. The system according to claim 16, wherein:
if all of the cells of its submodule have zero electric power, it is configured to execute:
a module for estimating the I-V curve associated with said first photovoltaic cell by searching, in a database of I-V curves, for an I-V curve defined by $\{(I,V)$ such that $I \geq 0$ and $V=0\}$ and $\{(I,V)$ such that $I=0$ and $V \geq 0\}$.

18. The system according to claim 16, wherein:
if at least one cell of said submodule has a nonzero electric power, it is configured to implement a loop of searching for the I-V curve associated with said first photovoltaic cell, said search loop comprising:
a step of applying a first current;
a step of determining, for each photovoltaic cell of said submodule, the voltage of the cell from the following relationship:

$$V_{cell\_k}(I_{in}) = (P_{elec\_healthy} - \Delta P_{th\_cell\_k}) / I_{in}$$

wherein:
$V_{cell\_k}$ corresponds to the voltage of each photovoltaic cell of said submodule, where k=1 to n photovoltaic cells in the submodule;
$I_{in}$ corresponds to said first current applied at input;
$P_{elec\_healthy}$ corresponds to the power supplied by a photovoltaic cell in a healthy state;
$\Delta P_{th\_cell\_k}$ corresponds to the energy losses caused by each faulty photovoltaic cell;
a step of determining the sum of the voltages of all of the photovoltaic cells of the submodule;
a step of checking whether said sum is zero or nonzero;
if said sum is zero:
a step of estimating the I-V curve associated with said first photovoltaic cell by searching, in a database of I-V curves, for an I-V curve for which the point whose coordinates are said voltage determined for the first photovoltaic cell and the first current applied at input belongs to the curve;
if said sum is nonzero;
a step of modifying the first current applied at input and of implementing said search loop again, taking into account the modified first current.

* * * * *